July 29, 1958 F. E. BARRON ET AL 2,845,497

TRANSISTORIZED AMPLIFIER CIRCUITS

Filed March 22, 1954

INVENTORS
FRED E. BARRON
SAMUEL F. LYBARGER
BY
Brown, Critchlow, Flick & Peckham
THEIR ATTORNEYS United States Patent Office 2,845,497

Patented July 29, 1958

2,845,497

TRANSISTORIZED AMPLIFIER CIRCUITS

Fred E. Barron, Pittsburgh, and Samuel F. Lybarger, Canonsburg, Pa., assignors to E. A. Myers & Sons, Inc., Pittsburgh, Pa., a corporation of Pennsylvania Application March 22, 1954, Serial No. 417,726

3 Claims. (Cl. 179—171)

This invention relates to amplifying circuits utilizing transistors, and to circuits especially useful for hearing aids and the like.

In a transistor amplifier, particularly one using a common emitter connection, it usually is necessary to have a condenser of relatively large capacity in series with the input electrode of the transistor to permit operation at its optimum point. Because a transistor is a nonlinear semiconducting device, direct currents flow more readily in one direction than the other. Under certain conditions of unusually high signal voltage, the condenser will assume a direct current charge, due to rectification, of such polarity that when the signal voltage is removed the condenser will have to become discharged by current traveling in the "hard flow" direction through the transistor. This requires a finite and noticeable discharge time, during which the transistor operating point is shifted in such a way that the transistor momentarily ceases to amplify incoming signal voltages. In other words, immediately following the cessation of a loud signal applied to the hearing aid microphone, there is a momentary blocking of the hearing aid while the condenser is discharging and the transistor returning to its normal operating point. Such a blocking condition is very disturbing to some hearing aid users who use their aids in environments where there are frequent loud sounds of short duration.

In a transistor hearing aid amplifier of multiple stages it is customary to make the resistance of the volume control, which is between two stages, about ten times the input impedance of the following stage so that there will be no appreciable loss of power in the volume control itself. In such a case, as the volume control is moved from its low resistance position to its high resistance position the load impedance on the output of the first stage will vary over a ratio of about 10 to 1. This will cause a change in the input impedance of the first stage that may have a detrimental effect on the frequency response characteristics of the over-all circuit, in that some frequencies will be attenuated more rapidly than others as the volume control setting is reduced. Such an effect is undesirable in a hearing aid, particularly when a magnetic microphone is employed. The frequency response of such microphones varies appreciably from the desired response if the impedance into which the microphone work is not held within a rather narrow range.

It is among the objects of this invention to provide a transistorized amplifier circuit which avoids blocking, which has smooth valume control action with no undesirable change of input impedance at low volume control settings, and which can accomplish both of these things by the addition of a single component.

The invention is illustrated in the accompanying drawings, in which

Figure 1:
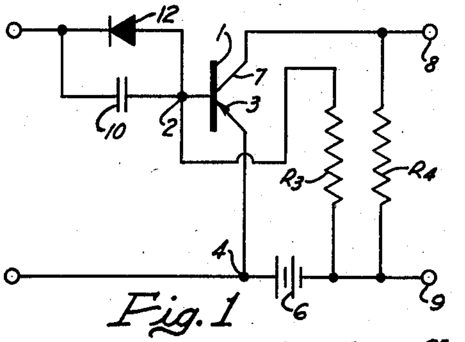
Fig. 1 is a circuit diagram of one embodiment.

Referring to Fig. 1 of the drawings, one stage of a sound amplifying circuit is shown which includes a transistor 1. The transistor has an input electrode 2 that also serves as one input terminal of the stage, an emitter connection 3 connected to the other input terminal 4 and one side of a battery 6, and a collector 7 connected to an output terminal 8 of the stage. The other output terminal 9 is connected to the opposite side of the battery. A bias resistor $R_3$ is connected with the second output terminal 9 and the input electrode 2 of the transistor. The optimum performance of a transistor amplifier stage is achieved at a particular operating current, such current being obtained by the adjustment of the bias resistor. It is necessary to have a coupling condenser 10 in series with the input electrode to prevent flow of direct current in the emitter circuit through the components (not shown) connected with the input terminals, for such current flow would disturb the bias conditions of the transistor so that it would not be operating at its optimum point. The amplified signal output is taken across the output terminals, between which there is a resistor $R_4$.

A pointed out earlier herein, unusually high signal voltage will cause momentary blocking of the hearing aid while the condenser 10 is discharging in the hard-flow direction through the transistor; that is, from the input electrode to the emitter connection. In accordance with this invention this blocking effect can be avoided by shunting directly across the condenser means adapted to provide an additional direct current discharge path in one direction for the condenser. The resistance of this means must be sufficiently low for the condenser to discharge through it must faster than through the transistor. On the other hand, the same means must have enough resistance to flow of direct current in the opposite direction, as compared with the resistance of the input electrode in the same opposite direction, to avoid interfering with normal operation of the transistor. It has been found that this "opposite direction" resistance of the shunting means should be at least about fifty times larger than the input electrode resistance in the same direction, and preferably between about 100 and 250 times as large.

A satisfactory means for this purpose is a rectifying diode 12, of germanium for example, shunted across the condenser. Because the alternating current impedance of the condenser is small, the diode will have essentially no effect on the alternating current signal voltage. Under normal operating conditions, the polarity of the direct current voltage appearing across the condenser will be such that the condenser will not discharge through the diode, but may discharge through the transistor emitter-to-base circuit in the normal manner. After the cessation of an extremely strong signal, however, the condenser becomes charged in the opposite direction because of the rectifying action of the transistor emitter-to-base circuit. When this situation occurs the condenser can no longer discharge readily through the transistor, because to do so current would have to flow in the hard-flow direction. It can now, however, discharge through the easy-flow direction of the diode across the condenser, which it does almost instantaneously, thereby eliminating the noticeable blocking effect that would otherwise have occurred. With operating conditions now back to normal, the diode again has essentially no effect on the circuit.

The proper operating current or collector current is affected by a number of the transistor parameters, but ultimately it is adjusted by the bias resistor $R_3$. The collector currrent is related to the transistor and circuit parameters in the following manner in the circuit of Fig. 1:

$$i_c = I_{co} + \alpha i_e \text{ (from transistor theory)}$$

but also $$i_c + i_{R_3} = i_e$$

and $$i_{R_3} = E/R_3 \text{ if } R_3 >> r_e$$

Combining these two equations $$i_c = \frac{I_{co} + \propto E/R_3}{1 - \propto}$$

where:

$i_c$=the D. C. collector current
$I_{co}$=the cutoff current
$i_e$=the emitter current
$\propto$=the gain factor of the transistor
$R_3$=the bias resistor, and
$i_{R_3}$=the current flowing through the bias resistor Since the back resistance of the diode shown in Fig. 1 is very high compared to other resistances in the amplifying circuit, it does not have any appreciable effect on the direct current bias established by the bias resistor, nor on the collector current $i_c$.

Figure 2:
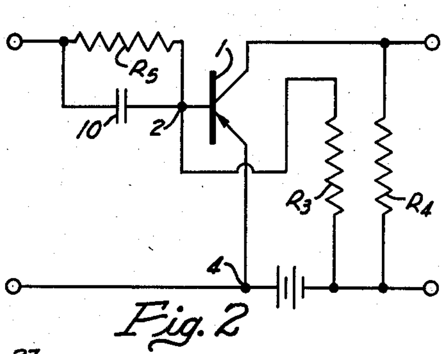
Figs. 2, 3 and 4 are diagrams of further embodiments.

Another means of reducing the block effect is shown in Fig. 2, where the diode has been replaced by a resistor $R_5$ which also shunts the condenser. The resistance value of this resistor is selected so that it is small compared to the resistance of the emitter-base circuit of the transistor in the hard-flow direction, and yet large compared with the emitter-base resistance in the conductive or easy-flow direction. Such a resistor will not disturb the transistor operating point to an extent that cannot be readily compensated for by adjustment of bias resistor $R_3$, as will be explained later on.

Figure 3:
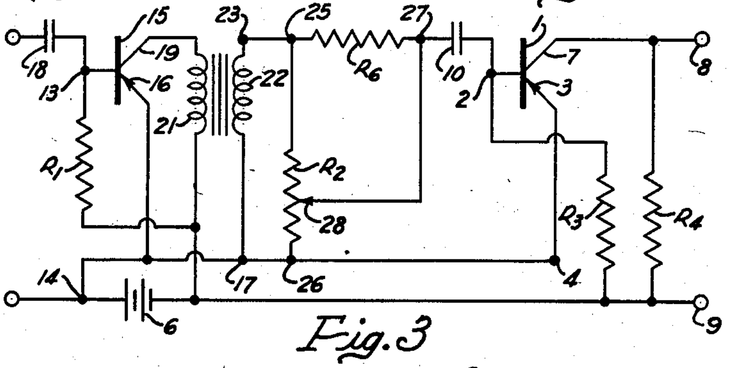

Two stages of amplification are shown in the circuit in Fig. 3, the second stage being like the one illustrated in Fig. 1 but without the diode. The first stage includes a transistor 15, the emitter 16 of which is connected with an output terminal 17 of that stage and with one side of the battery. A bias resistor $R_1$ connects the input of the transistor with the opposite side of the battery. There is a condenser 18 in series with the transistor input. The collector 19 of transistor 15 is connected to the primary 21 of a transformer which is also connected with the battery. One end of the secondary 22 of the transformer is connected to output terminal 17, while the opposite end of the transformer is connected to the other output terminal 23 of the first stage. Between the two stages there is a volume control provided with three terminals 25, 26 and 27. The resistance element $R_2$ of the volume control is connected in parallel with the secondary of the transformer, while the adjustable contact member 28 of the control has its terminal 27 electrically connected with the condenser 10 of the second transistor.

In such transistor amplifiers the input impedance of the first stage is a function of the output load on that stage as indicated by the following equation:

$$R_i = r_e + r_b + r_e\left(\frac{r_m - r_b}{r_e + r_c - r_m + R_L}\right)$$

$$= r_e + r_b + r_e\left(\frac{r_m - r_b}{r_e + r_c - r_m + (N_1/N_2)^2 R_L'}\right)$$

where:

$R_i$=the input impedance of the 1st stage of the transistor amplifier, terminals 13 and 14, Fig. 3
$r_e$=the transistor emitter resistance
$r_b$=the transistor base resistance
$r_c$=the transistor collector resistance
$r_m$=the transistor internal generator resistance
$R_L$=the effective load on the output of the 1st stage
$R_L'$=the effective load across the secondary winding of the transformer
$N_1/N_2$=the turns ratio of the transformer If a transistor circuit has the following constants:

| | |
|---|---|
| $r_e$=20 ohms | $R_2$=10,000 ohms |
| $r_b$=500 ohms | $R_6=\infty$ |
| $r_c=.6\times10^6$ ohms | $(N_1/N_2)^2=20$ |
| $r_m=.588\times10^6$ ohms | |

it can be shown by the preceding equation that if the volume control is moved from its maximum position (least resistance) toward its minimum or off position the input impedance presented to the hearing aid microphone will drop from 965 ohms to only 657 ohms. Assuming that the microphone has been designed to work into a normal impedance of 1,000 ohms, this drop in input impedance will have a detrimental effect as has been mentioned earlier herein. By adding a resistor $R_6$, as shown in Fig. 3, it may be shown that the input impedance now, instead of dropping to 657 ohms, will drop only to 800 ohms (if $R_6$=2,000 ohms).

Figure 4:
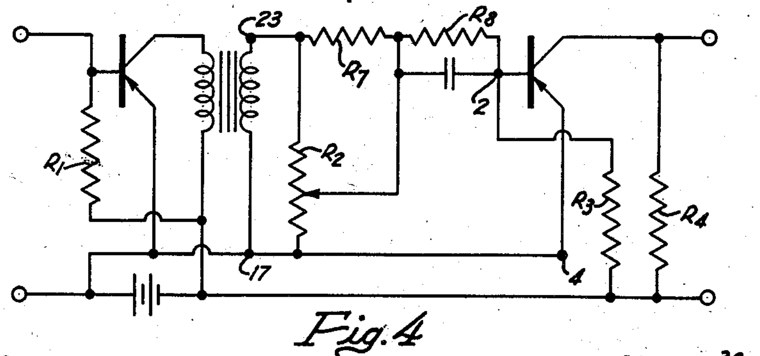
Figure 5:
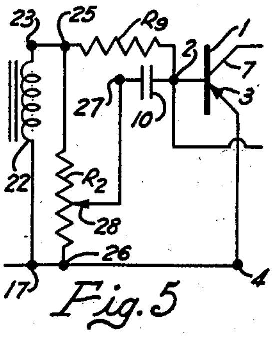
Figs. 5, 6 and 7 are fragmentary views of still other forms of the invention.

As shown in Fig. 4, the anti-blocking features of the circuit in Fig. 2 may be combined with the impedance variation reduction features of the circuit of Fig. 3. This is done by substituting a resistor $R_7$ for $R_6$, and a resistor $R_8$ for $R_5$. The adjacent ends of the two resistors are connected with volume control terminal 27. A simpler way to accomplish the same result is to combine the two resistors $R_7$ and $R_8$ into a single resistance $R_9$ as shown in Fig. 5.

Figure 6:
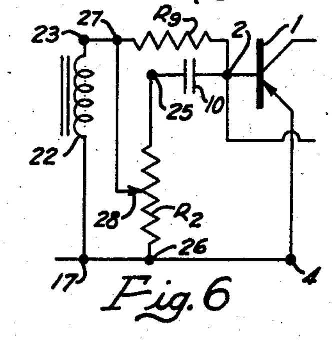

In Fig. 6, another possible connection of the volume control is shown. Terminal 25 of resistance element $R_2$ of the control is connected with the condenser, while terminal 27 of the adjustable contact member 28 is connected with output terminal 23 of the first stage. With this kind of connection the input impedance of the first stage rises as the volume control setting is reduced, so that the input impedance with volume control maximum is 965 ohms. When the volume control is at its minimum or off position, the input impedance is increased to 1600 ohms. A change in this direction as the volume control setting is reduced is not nearly so detrimental as a reduction in input impedance and can produce very desirable frequency response characteristics in the hearing aid.

In the circuit of Fig. 6, the resistor $R_9$ now has an additional function, in that it changes the rate of attenuation at the low end of the volume control and provides a smoother acting control. What this means to the hearing aid user is that when the volume control is first turned on the intensity of the amplified sounds increases gradually rather than suddenly. Although this change in attenuation curve of the control might be accomplished by merely changing the taper of the control, it is often not within the limits of practicality to do so in the small size control that is used in a hearing aid. The other two functions of this resistor $R_9$ are the same as before; namely, it eliminates the blocking effect by providing a low resistance discharge path for condenser 10, and it prevents the load on the secondary 22 of the interstage transformer from rising above a certain value, thereby preventing the input impedance of the first stage of the amplifier from falling below a certain value.

In the circuits of Figs. 2, 4, 5 and 6, where the blocking prevention diode has been replaced by a resistor in one stage, the resistor does have an appreciable effect on the collector current of that stage. The effect of this resistor on collector current is shown in the following equations which apply specifically to the circuit of Fig. 5, but by substituting other resistor values could also apply to the circuits of Figs. 2, 3 or 6. The current relationships in the transistor stage now become $$i_c = I_{co} + \propto i_e$$

$$i_c + i_{R_3} = i_e + i_{R_9}$$

where $R_9$ is the blocking prevention resistor and is assumed to be large compared with any direct current resistance in series with it, such as resistance in the transformer secondary 22. These equations may be combined to show that $$i_c = I_{co}\frac{(1+r_e/R_9+r_e/R_3)+\alpha E/R_3}{1-\alpha+r_e/R_9+r_e/R_3}$$

where $r_e$ represents the internal direct current resistance of the transistor and all other quantities are the same as previously defined. From this equation the proper ratio of $R_9$ to $R_3$ can be determined for any desired operating current for the collector circuit.

Once the proper operating current is known, there are several other factors that must be simultaneously taken into consideration in establishing proper values of $R_9$ and $R_3$. Since $R_3$ would have a loading effect on the input of transistor 1 if it were made too small, its value is usually kept not less than 10 times the input impedance of the transistor. This consideration also limits the range of $R_9$, since, as $R_9$ is made smaller, $R_3$ will also have to be made smaller to maintain the same value of collector current, and if $R_9$ is too large it will be ineffective in providing the desired low resistance discharge path for the condenser. In practice, it has been found practical to limit the range of $R_9$ to 2000–5000 ohms, although under some conditions, it may be desirable to use values slightly outside of this range. In general, by limiting the value of $R_9$ to this range, the proper operating current may be obtained by adjusting $R_3$, without the necessity of using $R_3$ values lower than 10 times the input impedance of the transistor; i. e., resistance of not less than 10,000 ohms.

From the collector current equation above, it may be shown that if $r_e$ is 20 ohms and $R_9$ is 2000 ohms, for any normally encountered value of $R_3$, the collector current, would be reduced by 33% from what it was with $R_9$ out of the circuit for an alpha of .98; and would be reduced by 50% for an alpha of .99. Reductions in $R_3$ of 33% and 50%, respectively, are therefore needed in this typical example to compensate for the addition of $R_9$ to the circuit. For a transistor having an alpha of .99, typical values of $R_3$ might be 120,000 ohms with $R_9$ out of the circuit ($R_9=\infty$) and 600,000 ohms where $R_9$ equals 2000 ohms.

Figure 7:
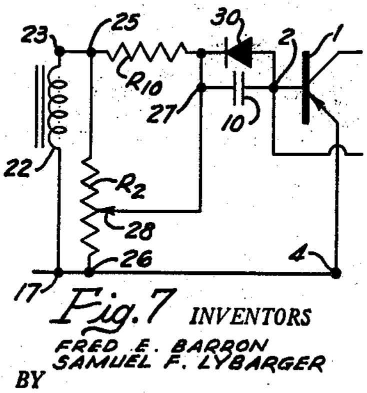

In the embodiment of the invention shown in Fig. 7, the circuit is similar to that of Fig. 4, but a rectifying diode 30 has been substituted for resistor $R_8$ and also a resistor $R_{10}$ takes the place of $R_7$. The result is smooth volume control action with avoidance of blocking. If desired, the volume control could be connected in the manner shown in Fig. 6.

According to the provisions of the patent statutes, we have explained the principle of our invention and have illustrated and described what we now consider to represent its best embodiment. However, we desire to have it understood that, within the scope of the appended claims, the invention may be practiced otherwise than as specifically illustrated and described.

We claim:

1. In an amplifier circuit, two transistors forming successive stages of amplification, the first of said stages having a pair of output terminals and the second of said stages having a pair of input terminals, a volume control having a resistance element with two terminals and having an adjustable contact member engaging said element, said contact member having one terminal, means electrically connecting one of the resistance element terminals to one of said output terminals, means electrically connecting another of the volume control terminals to the second of said output terminals, a condenser connected in series between the third terminal of the volume control and one of said input terminals, and resistance means connected with one of said output terminals and said one input terminal and shunting the condenser, said resistance means being adapted to provide an additional discharge direct current path in one direction for said condenser of sufficiently low resistance to avoid blocking in said second stage and to simultaneously reduce variation in reflected input impedance as said adjustable contact member is moved along the volume control resistance element.

2. A circuit as defined in claim 1, in which it is the adjustable contact member terminal that is electrically connected to one of said output terminals.

3. In an amplifier circuit, two transistors forming successive stages of amplification, the first of said stages having a pair of output terminals and the second of said stages having a pair of input terminals, a volume control having a resistance element electrically connected to said output terminals, the volume control also including an adjustable contact member engaging said resistance element, a condenser connected in series between said contact member and one of said input terminals, and resistance means connected with one of said output terminals and said one input terminal and shunting the condenser, said resistance means being adapted to provide an additional discharge direct current path in one direction for said condenser of sufficiently low resistance to avoid blocking in said second stage and to simultaneously reduce variation in reflected input impedance as said adjustable contact member is moved along the volume control resistance element.

References Cited in the file of this patent

UNITED STATES PATENTS

| | | |
|---|---|---|
| 1,907,741 | Cloud | May 9, 1933 |
| 2,541,322 | Barney | Feb. 13, 1951 |
| 2,597,520 | O'Brien | May 20, 1952 |
| 2,644,896 | Lo | July 7, 1953 |
| 2,647,957 | Mallinckrodt | Aug. 4, 1953 |
| 2,666,817 | Raisbeck et al. | Jan. 19, 1954 |
| 2,759,052 | Macdonald et al. | Aug. 14, 1956 |